United States Patent
Lopez

(10) Patent No.: US 9,941,444 B2
(45) Date of Patent: Apr. 10, 2018

(54) LIGHT EMITTING DIODE WITH STRUCTURED SUBSTRATE

(71) Applicant: KONINKLIJKE PHILIPS N.V., Eindhoven (NL)

(72) Inventor: Toni Lopez, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/112,291

(22) PCT Filed: Jan. 16, 2015

(86) PCT No.: PCT/IB2015/050323
§ 371 (c)(1),
(2) Date: Jul. 18, 2016

(87) PCT Pub. No.: WO2015/118419
PCT Pub. Date: Aug. 13, 2015

(65) Prior Publication Data
US 2016/0336485 A1 Nov. 17, 2016

Related U.S. Application Data

(60) Provisional application No. 61/936,362, filed on Feb. 6, 2014.

(51) Int. Cl.
*H01L 33/00* (2010.01)
*H01L 33/20* (2010.01)
(Continued)

(52) U.S. Cl.
CPC .............. *H01L 33/20* (2013.01); *H01L 33/22* (2013.01); *H01L 33/44* (2013.01); *H01L 33/46* (2013.01)

(58) Field of Classification Search
CPC ......... H01L 33/10; H01L 33/20; H01L 33/44; H01L 33/22; H01L 33/46
See application file for complete search history.

(56) References Cited

U.S. PATENT DOCUMENTS

| 4,038,580 A | 7/1977 | Porret |
| 6,791,116 B2 * | 9/2004 | Hirano ................. H01L 33/508 257/100 |

(Continued)

FOREIGN PATENT DOCUMENTS

| EP | 1225643 A1 | 7/2002 |
| EP | 1367656 A2 | 12/2003 |

(Continued)

OTHER PUBLICATIONS

H. H. Barrett and S. F. Jacobs, "Retroreflective arrays as approximate phase conjugators", 1979, Opt. Lett. 4, p. 190-192, Jun. 1979.*

(Continued)

*Primary Examiner* — Nikolay Yushin

(57) ABSTRACT

Embodiments of the invention include a semiconductor light emitting device. The device includes a substrate having a first surface and a second surface opposite the first surface. The device further includes a semiconductor structure disposed on the first surface of the substrate. A cavity is disposed within the substrate. The cavity extends from the second surface of the substrate. The cavity has a sloped side wall.

20 Claims, 3 Drawing Sheets

(51) Int. Cl.
  *H01L 33/22* (2010.01)
  *H01L 33/44* (2010.01)
  *H01L 33/46* (2010.01)

(56) References Cited

U.S. PATENT DOCUMENTS

| | | | | |
|---|---|---|---|---|
| 7,010,012 | B2* | 3/2006 | Hwang | H01S 5/423 |
| | | | | 372/43.01 |
| 7,376,169 | B2* | 5/2008 | Henrichs | H01S 5/18391 |
| | | | | 372/50.11 |
| 7,786,493 | B2* | 8/2010 | Watanabe | H01L 21/0242 |
| | | | | 257/88 |
| 8,081,671 | B2* | 12/2011 | Carter | H01S 5/0264 |
| | | | | 372/50.1 |
| 9,368,697 | B2* | 6/2016 | Won | H01L 33/48 |
| 2003/0035454 | A1* | 2/2003 | Hwang | H01S 5/423 |
| | | | | 372/50.1 |
| 2003/0127654 | A1 | 7/2003 | Eisert et al. | |
| 2005/0173725 | A1* | 8/2005 | Kunisato | H01L 33/0079 |
| | | | | 257/103 |
| 2005/0253157 | A1 | 11/2005 | Ohashi et al. | |
| 2006/0198404 | A1* | 9/2006 | Henrichs | H01S 5/18391 |
| | | | | 372/29.02 |
| 2008/0064130 | A1* | 3/2008 | Kunisato | H01L 33/0079 |
| | | | | 438/26 |
| 2008/0210957 | A1* | 9/2008 | Watanabe | H01L 21/0242 |
| | | | | 257/89 |
| 2008/0247436 | A1* | 10/2008 | Carter | H01S 5/0264 |
| | | | | 372/50.11 |
| 2012/0012856 | A1 | 1/2012 | Chen et al. | |
| 2015/0207034 | A1* | 7/2015 | Sakong | H01L 33/22 |
| | | | | 257/13 |

FOREIGN PATENT DOCUMENTS

| | | |
|---|---|---|
| JP | H03227078 A | 10/1991 |
| JP | 2009032958 A | 2/2009 |

OTHER PUBLICATIONS

Kasarova et al., Analysis of the dispersion of optical plastic materials, 2007, Optical Materials, vol. 20 pp. 1481-1490, published Sep. 7, 2006.*

Verlaan et al., "The effect of composition on the bond structure and refractive index of silicon nitride deposited by HWCVD and PECVD", 2009, Thin Solid Films, vol. 517, pp. 3499-3502, (published Jan. 27, 2009).*

EPO as ISA, International Search Report and Written Opinion dated May 22, 2015 from International Application No. PCT/EP2015/050323, filed Jan. 16, 2015, 12 pages.

First Office Action dated Feb. 5, 2018, China Patent Application No. 201580007506.8, 10 pages.

* cited by examiner

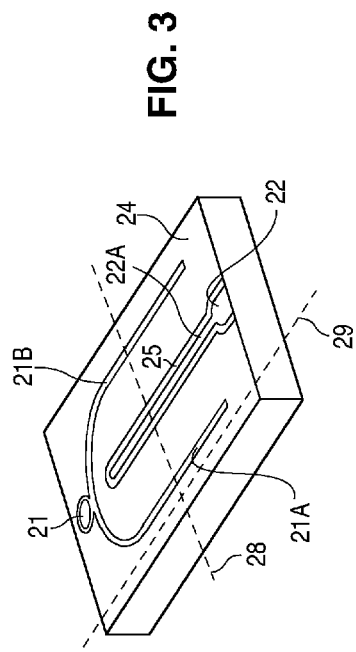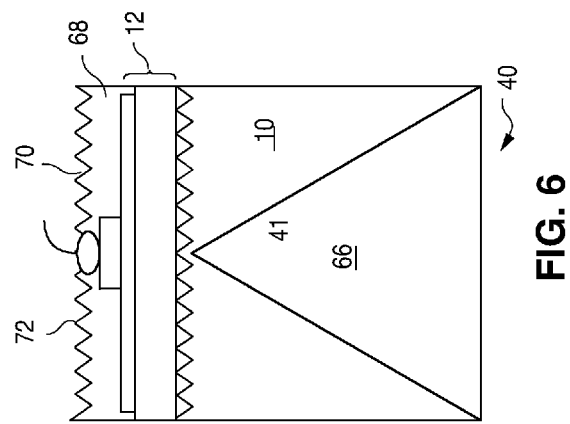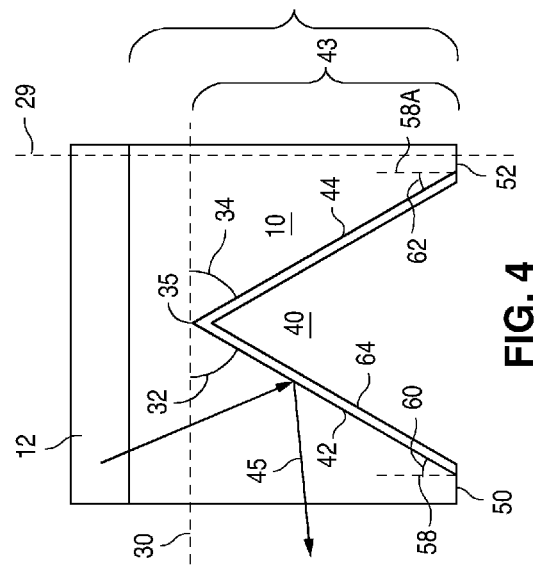

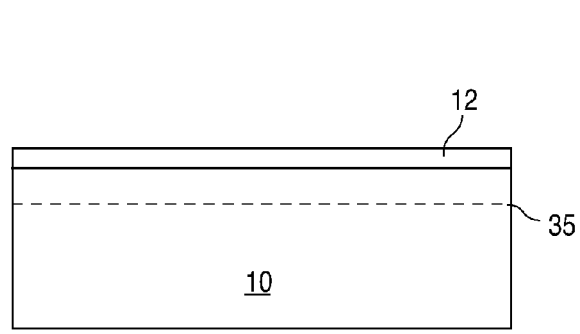
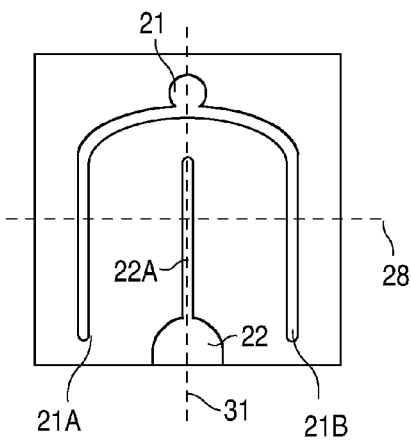
FIG. 5A  FIG. 5B
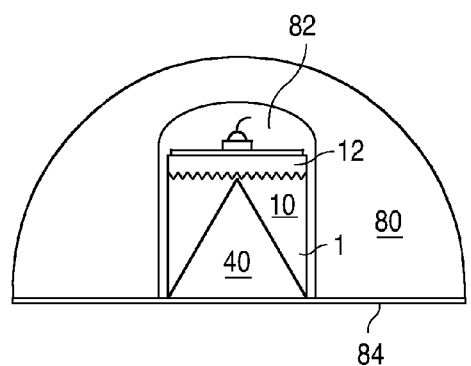
FIG. 7

LIGHT EMITTING DIODE WITH STRUCTURED SUBSTRATE

CROSS-REFERENCE TO RELATED APPLICATIONS

The present application is a § 371 application of International Application No. PCT/IB2015/050323 filed on Jan. 16, 2015 and entitled "LIGHT EMITTING DIODE WITH STRUCTURED SUBSTRATE," which claims priority to U.S. Provisional Application No. 61/936,362, filed Feb. 6, 2014. International Application No. PCT/IB2015/050323 and U.S. Provisional Application No. 61/936,362 are incorporated herein.

FIELD OF THE INVENTION

The present invention relates to a light emitting device such as a light emitting diode with a hollow formed in the substrate.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, silicon, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a prior art device described in more detail in US 2012/0012856. US 2012/0012856 describes shaping the sapphire substrate of a III-nitride light emitting diode. US 2012/0012856 describes the device of FIG. 1 in paragraph 45. The device of FIG. 1 is "a GaN light emitting diode [401] comprising a sapphire substrate 404 and an epitaxial layer 402. Slopes 405 and depressions 4042 are both formed" in the substrate. A "lower portion of the sapphire substrate 404 is enveloped in a distributed Bragg reflector 407. A layer of silver glue 408 is applied below the distributed Bragg reflector 407 and on slopes 405 of the sapphire substrate 404 for reflecting light from the slopes 405 of the sapphire substrate 404. As we can expect, the . . . [device of FIG. 1] has good light extraction efficiency due to increase of side light beams."

SUMMARY

It is an object of the invention to provide a device with a hollow, or cavity, formed in the substrate. Such a device may efficiently extract light through the sidewalls of the device. The cavity may take the form of a chamber in any suitable geometric shape e.g. a prism, prismatoid or a polyhedron.

Embodiments of the invention include a semiconductor light emitting device. The device includes a substrate having a first surface and a second surface opposite the first surface. The device further includes a semiconductor structure disposed on the first surface of the substrate. A cavity is disposed in the substrate. The cavity extends from the second surface of the substrate. The cavity has a sloped side wall.

BRIEF DESCRIPTION OF THE DRAWINGS

FIG. 3 is a plan view of the device illustrated in FIG. 2.

FIG. 4 is a cross sectional view of a device including a shaped substrate, taken along axis 28, shown in FIG. 3.

FIG. 5A is a cross sectional view of a device including a shaped substrate, taken along axis 29, shown in FIG. 3.

FIG. 5B is a top view of a square device.

FIG. 6 illustrates a device including a high refractive index coating and a thermally conductive material.

FIG. 7 illustrates an encapsulated device with a gap disposed between the device and the encapsulant.

DETAILED DESCRIPTION

Embodiments of the invention are directed to light emitting devices such as LEDs that extract light primarily from the sides of the device.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
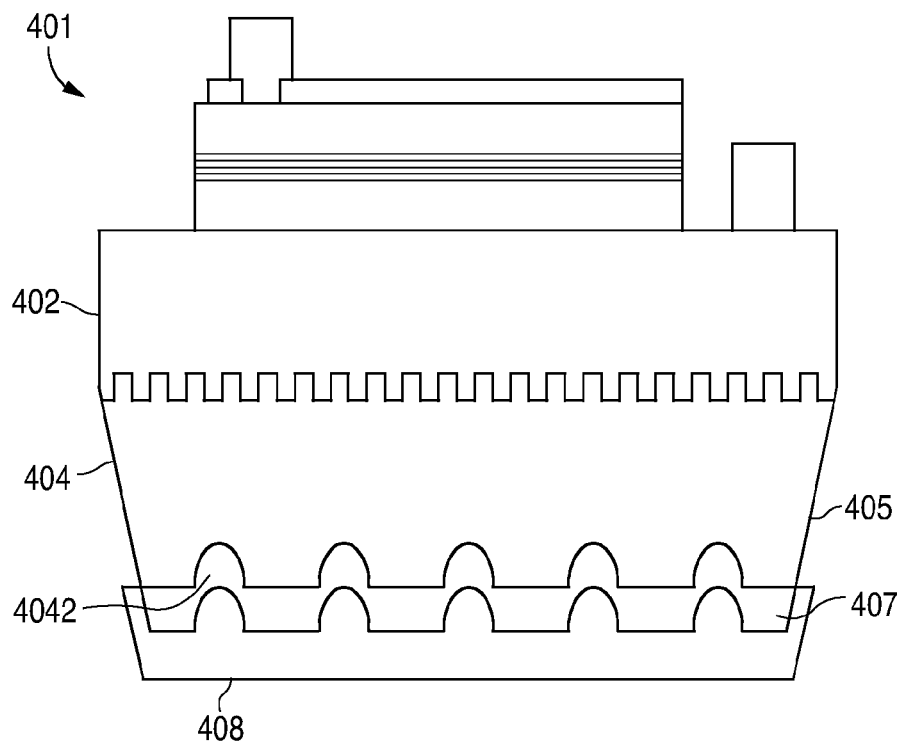
FIG. 1 illustrates a prior art device with a shaped sapphire substrate.
Figure 2:
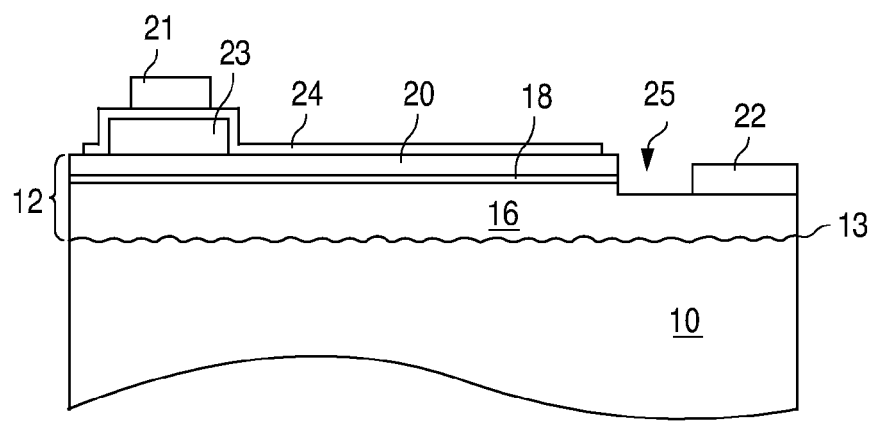
FIG. 2 is a cross sectional view of a III-nitride device structure according to embodiments of the invention.

FIG. 2 illustrates the device structure of a III-nitride LED that may be used in embodiments of the present invention. Any suitable semiconductor light emitting device structure may be used and embodiments of the invention are not limited to the arrangement illustrated in FIG. 2. The device of FIG. 2 is formed by growing a III-nitride semiconductor structure 12 on a growth substrate 10 as is known in the art. The growth substrate is often sapphire but may be any suitable substrate such as, for example, a non-III-nitride material, sapphire, SiC, Si, GaN, or a composite substrate. A surface 13 of the growth substrate on which the III-nitride semiconductor structure 12 is grown may be patterned, roughened, or textured before growth, which may improve light extraction into the substrate.

The semiconductor structure 12 includes a light emitting or active region 18 sandwiched between n- and p-type regions 16 and 20. An n-type region 16 may be grown first and may include multiple layers of different compositions and dopant concentration including, for example, preparation layers such as buffer layers or nucleation layers, which may be n-type or not intentionally doped, and n- or even p-type device layers designed for particular optical, material, or electrical properties desirable for the light emitting region to efficiently emit light.

A light emitting or active region 18 is grown over the n-type region. Examples of suitable light emitting regions include a single thick or thin light emitting layer, or a multiple quantum well light emitting region including multiple thin or thick light emitting layers separated by barrier layers.

A p-type region 20 may be grown over the light emitting region. Like the n-type region, the p-type region may include multiple layers of different composition, thickness, and dopant concentration, including layers that are not intentionally doped, or n-type layers.

A portion of the p-type region 20 and the active region 18 is removed to expose a portion of the n-type region 16 on which an n-contact 22 is formed.

A current blocking layer 23 may be formed on the p-type region 20 in an area where a p-contact is formed. Current blocking layer 23 prevents current from being injected in the active region directly beneath the p-contact, which prevents or reduces the amount of light generated in this region. Light generated directly beneath the p-contact may be lost to absorption by the p-contact 21. The current blocking layer 23 may be formed from any suitable material including, for example, dielectric materials such as oxides of silicon, $SiO_2$, and nitrides of silicon.

A transparent conductive layer 24 may be formed over the current blocking layer and the remaining surface of p-type region 20. Transparent conductive layer 24 may provide current spreading in the p-type region 20. Examples of suitable materials include transparent conductive oxides such as indium tin oxide (ITO).

A p-contact 21 is formed over optional current blocking layer 23. The n- and p-contacts 22 and 21 may be any suitable material, such as aluminum, gold, or silver. The n- and p-contacts 22 and 21 need not be the same material. The n- and p-contacts 22 and 21 are electrically isolated from each other by a gap 25 which may be filled with a dielectric such as an oxide of silicon or any other suitable material.

FIG. 3 is a plan view of the n- and p-contacts illustrated in FIG. 2. The n-contact includes an n-contact pad 22 and an n-contact arm 22A that is narrower than the n-contact pad 22 and extends from the n-contact pad 22. The p-contact includes a p-contact pad 21 and two p-contact arms 21A and 21B that are narrower than the p-contact pad 21 and extend from the p-contact pad 21. The n-contact arm 22A interposes the p-contact arms 21A and 21B in the arrangement illustrated in FIG. 3. A gap 25 electrically isolates the n-contact pad 22 and n-contact arm 22A from the p-type region of the device. Any suitable arrangement of contacts may be used. The invention is not limited to the arrangement illustrated in FIG. 3.

Light may be extracted through the top surface of the device through transparent conductive layer 24.

LED wafers are often diced into square LEDs. In some embodiments, the device is a shape other than square. For example, the device illustrated in FIG. 3 is rectangular. The device may be any suitable shape, including but not limited to polygonal, circular, and hexagonal. In the rectangular device illustrated in FIG. 3, the short side of the device may be, for example, 500 µm wide in some embodiments, at least 350 µm wide in some embodiments, and no more than 650 µm wide in some embodiments. The long side of the rectangular device illustrated in FIG. 3 may be, for example, at least 650 µm wide in some embodiments, no more than 700 µm wide in some embodiments, at least 550 µm wide in some embodiments, and no more than 800 µm wide in some embodiments.

In embodiments of the invention, the substrate 10 is shaped to improve light extraction from the sides of the device. In some embodiments, a cavity, also referred to herein as a hollow, is formed in the substrate 10. The cavity may take the form of a chamber in any suitable geometric shape e.g. a prism, prismatoid or a polyhedron. FIGS. 4 and 5A are cross sections illustrating one example of a cavity.

FIG. 4 is a partial cross section taken along axis 28, illustrated in FIG. 3. FIG. 5A is a partial cross section taken along axis 29, illustrated in FIG. 3. FIGS. 4 and 5A show the shape of growth substrate 10. The semiconductor structure 12 is included in simplified form for reference. The contacts 21 and 22, current blocking layer 23, and transparent conductive layer 24 are omitted for clarity.

As illustrated in FIGS. 4 and 5A, the substrate 10 is shaped to form a hollow 40 that extends from the surface of the substrate opposite the semiconductor structure 12 toward the semiconductor structure. The hollow 40 has a triangular cross section in the cross section illustrated in FIG. 4. The external sidewalls of the substrate are substantially vertical, as in a conventional device. The external sidewalls are often formed when the device is diced from a wafer of devices, as in a conventional device.

In the cross section taken along the short side of the rectangular device, illustrated in FIG. 4, the sloped sidewalls 42 and 44 of the hollow 40 each form an acute angle 32 and 34 with a plane 30 that is perpendicular to the growth direction of the semiconductor structure (i.e., parallel to a major plane of the semiconductor structure 12) and parallel to the surface of substrate 10 on which the semiconductor structure is grown. Angles 32 and 34 may be the same angle though they need not be. The sloped sidewalls 42 and 44 each form an acute angle 60 and 62 with a plane 58 and 58A that is parallel to the growth direction of the semiconductor structure and perpendicular to the surface of substrate 10 on which the semiconductor structure is grown. Angles 60 and 62 may be the same angle though they need not be. In some embodiments, angles 60 and 62 are 30° or less. In some embodiments, in the cross section illustrated in FIG. 4, in addition to sidewalls 42 and 44, the hollow 40 has a wall that is parallel to plane 30 (in other words, the cross section is a truncated triangle, rather than the triangle illustrated in FIG. 4). The growth substrate may have surfaces 50 and 52 adjacent to each of sidewalls 42 and 44. Surfaces 50 and 52 may be parallel to plane 30. Alternatively, the sidewalls 42 and 44 may extend to the outer edges of the substrate 10, eliminating surfaces 50 and 52.

In the cross section taken along the long side of the rectangular device near an edge of the device, illustrated in FIG. 5A, the top 35 of the triangular hollow 40 is illustrated as a dashed line. At every point along the dashed line depicting top 35, the cross section extending out of the plane of FIG. 5A is the cross section illustrated in FIG. 4. The location of axis 29, along which the cross section illustrated in FIG. 5A is taken, is illustrated in FIG. 4.

As illustrated by ray 45 in FIG. 4, light emitted by the light emitting region of semiconductor structure 12 toward substrate 10 may be incident on the side walls of the hollow 40, then reflected to escape the sides of the device.

In the plan view illustrated in FIG. 3, the device is rectangular, such that the cross section illustrated in FIG. 5A is substantially longer than the cross section illustrated in FIG. 4. In embodiments where the device is square or nearly square, as illustrated in FIG. 5B, the cross sections taken along axes 28 and 31 are similar in length. In some such embodiments, cross sections taken along both axes 28 and 31 may be the cross section illustrated in FIG. 4.

The shaped substrate may be formed by, for example, removing substrate material to form hollow 40, or by selectively growing a substrate to form hollow 40. Any suitable removal technique may be used, such as etching or laser blasting. The angle of incidence during laser blasting may be selected to form the shape illustrated in the cross section illustrated in FIG. 4.

The hollow comprises a significant portion of the volume of the substrate 10. For example, hollow 40 may be at least 50% of the total volume of substrate 10 (i.e., the total volume of substrate 10 being the volume of hollow 40 plus the volume of the remaining portion of substrate 10) in some embodiments, and at least 60% of the total volume of substrate 10 in some embodiments.

The substrate 10 has a thickness 41, illustrated in FIG. 4, the thickness 41 being measured in a direction perpendicular to both the first (top) surface on which the semiconductor structure 12 is formed and the second (bottom) surface from which the hollow 40 extends. The thickness 41 of substrate 10 may be at least 400 µm thick in some embodiments, at least 500 µm thick in some embodiments, and no more than 1000 µm thick in some embodiments. In some embodiments where the device is rectangular, the thickness 41 of substrate 10 is at least 90% of the length of the short side of the rectangle.

The deepest part 43 of the hollow 40, illustrated in FIG. 4, measured in the same direction as substrate thickness 41, may be at least 70% of the thickness of substrate 10 in some embodiments, at least 80% of the thickness of substrate 10 in some embodiments, at least 90% of the thickness of substrate 10 in some embodiments, at least 200 µm deep in some embodiments, at least 300 µm deep in some embodiments, and no more than 500 µm deep in some embodiments.

In some embodiments, the sloped sidewalls of the hollow 40 are coated with a reflective material 64, as illustrated in FIG. 4. Any suitable reflective material formed by any suitable technique may be used including, for example, reflective metals such as silver, reflective coatings such white reflective paint, or multi-layer structures such as distributed Bragg reflectors (DBRs). The reflective material 64 may be electrically conductive, or electrically insulating.

FIG. 6 illustrates a device including a high refractive index coating and a thermally conductive material.

In some embodiments, all or a portion of the hollow 40 is filled with a thermally conductive material 66, as illustrated in FIG. 6. Any suitable material may be used including, for example, metal such as copper. The thermally conductive material may be thermally connected to a heat sink or other suitable external structure.

In some embodiments, a high refractive index coating 68 is formed on the surface of the device on which the n- and p-contacts are formed, as illustrated in FIG. 6. The high refractive index coating 68 may improve light extraction from the sides of the device by increasing total internal reflection at the top surface of the device, which reduces the amount of light extracted from the top of the device. The high refractive index coating 68 may have a refractive index of at least 1.5 in some embodiments, at least 1.6 in some embodiments, at least 1.8 in some embodiments, and at least 2 in some embodiments. The high refractive index coating 68 may be any suitable material formed by any suitable technique. Examples include $SiO_x$, $SiO_2$, SiN, and dielectric materials formed by evaporation. The high refractive index coating 68 may be a multi-layer structure in some embodiments.

In some embodiments, a top surface 70 of the high refractive index coating 68 is roughened, patterned, or textured to improve light extraction. The roughened, patterned, or textured surface may diffract light and increase the amount of light that is radiated out the sides of the device. A photonic crystal structure or a grating structure optimized for side emission may be formed on the top surface 70 of high refractive index coating 68. For example, the top surface 70 of high refractive index coating 68 may be formed into 3-sided pyramids 72 in a periodic arrangement, such as, for example, a triangular lattice, honeycomb lattice, or any other suitable periodic arrangement. The pyramids 72 may be, for example, at least 0.5 µm tall in some embodiments, no more than 2 µm tall in some embodiments, and 1 µm tall in some embodiments. The bases of pyramids 72 may be, for example, at least 0.5 µm wide in some embodiments, no more than 2 µm wide in some embodiments, and 1 µm wide in some embodiments.

FIG. 7 illustrates an encapsulated device. The encapsulant 80 may be any suitable material such as, for example, epoxy, resin, glass, or silicone. The encapsulant 80 may be formed by any suitable technique including, for example, molding or a sol-gel process. In some embodiments, the encapsulant is formed separately then disposed over the device 1, for example by gluing directly to the device 1 or gluing to a mount 84 on which the device is disposed. In some embodiments, the device is disposed on a mount 84 and the encapsulant 80 and the mount 84 completely surround the device to prevent contaminants from reaching the device.

In some embodiments, the encapsulant 80 is shaped into a lens or other suitable optical element. For example, the encapsulant 80 may be shaped into the dome lens illustrated in FIG. 7, a Fresnel lens, or any other suitable shape. As illustrated in FIG. 7, the encapsulant 80 may extend over the sidewalls of the device 1. The encapsulant 80 may be wider along the bottom of the structure than the device 1.

In some embodiments, the encapsulant 80 is in direct contact with the device 1. In some embodiments, as illustrated in FIG. 7, a gap 82 separates device 1 and encapsulant 80. Gap 82 is often filled with air but may be filled with any suitable material. In some embodiments, encapsulant 80 has a high index of refraction. For example, the index of refraction of encapsulant 80 may be greater than 1 in some embodiments, at least 1.5 in some embodiments, and at least 1.8 in some embodiments. The material filling gap 82, if gap 82 is included, may be a low absorption, low index of refraction material. For example, the index of refraction if the material filling gap 82 may be no more than 1 in some embodiments.

Embodiments of the invention may have advantages over other available devices from which light is extracted primarily from the sides. The embodiments described herein may have improved extraction uniformity and reduced spottiness, as compared to currently available side-emission devices. The embodiments described herein may have a high extraction efficiency of light from the sides of the device. The embodiments described herein are fairly compact and cost effective, because they may be used as illustrated, without complicated, large, and expensive secondary optics.

Having described the invention in detail, those skilled in the art will appreciate that, given the present disclosure, modifications may be made to the invention without departing from the spirit of the inventive concept described herein. Any combination of the features described above is within the scope of the invention. For example, features illustrated above may be included in other embodiments, or omitted from other embodiments. Therefore, it is not intended that the scope of the invention be limited to the specific embodiments illustrated and described.

The invention claimed is:

1. A semiconductor light emitting device comprising:
   a substrate having a first surface and a second surface opposite the first surface;
   a semiconductor structure disposed on the first surface of the substrate, the semiconductor structure comprising a light emitting region sandwiched between n- and p-type regions, an n-contact connected to the n-type region, and a p-contact connected to the p-type region, the n- and p-contacts formed on the surface of the semiconductor structure opposite the first surface;

a hollow disposed in the substrate, the hollow extending from the second surface of the substrate, the hollow having a sloped side wall; and a high refractive index material disposed over the n- and p-contacts, the high refractive index material having a refractive index of at least 1.5.

2. The semiconductor light emitting device of claim 1 wherein:

the substrate has a thickness in a first direction, the first direction being perpendicular to the first and second surfaces; and a deepest part of the hollow measured in the first direction is at least 70% of the thickness of the substrate in the first direction.

3. The semiconductor light emitting device of claim 1 wherein the hollow comprises at least 50% of a volume comprising the volume of the hollow plus the volume of the substrate.

4. The semiconductor light emitting device of claim 1 wherein:

the semiconductor light emitting device is rectangular; and a thickness of the substrate at a thickest point of the substrate is at least 90% of a length of a short side of the rectangular semiconductor light emitting device.

5. The semiconductor light emitting device of claim 1 wherein an angle between the sloped side wall of the hollow and a plane perpendicular to the first surface is no more than 30°.

6. The semiconductor light emitting device of claim 1 wherein the first surface is textured.

7. The semiconductor light emitting device of claim 1, wherein a majority of light emitted from the light emitting region is extracted into the substrate.

8. The semiconductor light emitting device of claim 1, wherein light emitted from the light emitting region is extracted out of the semiconductor light emitting device through sides of the substrate and sides of the semiconductor structure.

9. The semiconductor light emitting device of claim 1, wherein the semiconductor light emitting device is a die having four sides at outer edges of the die, each side connecting the second surface of the substrate with the high refractive index material, and the hollow extends along an entire length of the die between two opposite sides of the die.

10. The semiconductor light emitting device of claim 1, wherein the sloped sidewall of the hollow is coated with a reflective material.

11. The semiconductor light emitting device of claim 1, wherein the hollow is filled with a thermally conductive material.

12. The semiconductor light emitting device of claim 1 wherein the hollow has a triangular cross section along a first axis.

13. The semiconductor light emitting device of claim 12 wherein the hollow has a triangular cross section along a second axis perpendicular to the first axis.

14. The semiconductor light emitting device of claim 13 wherein the semiconductor light emitting device is square.

15. The semiconductor light emitting device of claim 1 further comprising:

a transparent, conductive material disposed between the semiconductor structure and the high refractive index material.

16. The semiconductor light emitting device of claim 15 wherein a surface of the high refractive index material opposite the transparent conductive material is textured.

17. The semiconductor light emitting device of claim 16 wherein the textured surface of the high refractive index material comprises a plurality of 3-sided pyramids arranged in a lattice.

18. A semiconductor light emitting device comprising a substrate having a first surface and a second surface opposite the first surface;

a semiconductor structure disposed on the first surface of the substrate, the semiconductor structure comprising a light emitting region sandwiched between n- and p-type regions, an n-contact connected to the n-type region, and a p-contact connected to the p-type region;

a hollow disposed in the substrate, the hollow extending from the second surface of the substrate, the hollow having a sloped side wall;

a lens disposed over the semiconductor structure and the substrate, and extending along sidewalls of the semiconductor structure and the substrate; and a gap disposed between the semiconductor structure and the lens.

19. The semiconductor light emitting device of claim 18, wherein the gap extends between the lens and the sidewalls of the semiconductor structure and the substrate.

20. The semiconductor light emitting device of claim 18, wherein the lens completely surrounds the semiconductor structure and the substrate above the second surface.

* * * * *